United States Patent [19]
Bock et al.

[11] Patent Number: 5,434,804
[45] Date of Patent: Jul. 18, 1995

[54] METHOD AND APPARATUS FOR SYNCHRONIZING A JTAG TEST CONTROL SIGNAL TO AN ON-CHIP CLOCK SIGNAL

[75] Inventors: Robert Bock, Beaverton; James W. Alexander, Hillsboro, both of Oreg.

[73] Assignee: Intel Corporation, Santa Clara, Calif.

[21] Appl. No.: 175,792

[22] Filed: Dec. 29, 1993

[51] Int. Cl.$^6$ ............... G05B 23/02; G06F 11/27; H04L 7/00

[52] U.S. Cl. ............... 364/579; 375/354; 371/16.1; 371/16.2; 371/22.1; 371/22.3; 371/22.6

[58] Field of Search ............ 364/579, 578; 371/16.1, 371/16.2, 20.4, 22.1, 22.3, 22.6, 23, 71; 324/73.1; 375/106

[56] References Cited

U.S. PATENT DOCUMENTS

| | | | |
|---|---|---|---|
| 4,788,683 | 11/1988 | Hester et al. | 371/20 |
| 4,797,574 | 1/1989 | Okubo et al. | 307/269 |
| 4,914,325 | 4/1990 | Yamada | 307/592 |
| 4,928,290 | 5/1990 | Vo | 375/118 |
| 4,945,536 | 7/1990 | Hancu | 371/22.3 |
| 4,949,360 | 8/1990 | Martin | 375/106 |
| 5,128,970 | 7/1992 | Murphy | 375/106 |
| 5,157,781 | 10/1992 | Harwood et al. | 395/575 |
| 5,222,068 | 6/1993 | Burchard | 371/22.3 |
| 5,253,255 | 10/1993 | Carbine | 371/22.6 |
| 5,254,942 | 10/1993 | D'Souza et al. | 324/158 |
| 5,274,628 | 12/1993 | Thaller et al. | 370/46 |
| 5,280,539 | 1/1994 | Yeom et al. | 375/106 |
| 5,281,864 | 1/1994 | Hahn et al. | 307/272.2 |
| 5,329,471 | 7/1994 | Swoboda et al. | 364/578 |
| 5,331,571 | 7/1994 | Aronoff et al. | 364/490 |
| 5,331,669 | 7/1994 | Wang et al. | 375/118 |
| 5,357,626 | 10/1994 | Johnson et al. | 395/500 |
| 5,381,420 | 1/1995 | Henry | 371/22.3 |

OTHER PUBLICATIONS

Abu-Nofal, "TA 6.3: A Three-Million-Transistor Microporcessor", 1992 IEEE International Solid-State Circuits Conference, p. 108.

"Boundary-Scan Test, A Practical Approach" pp. 74–78, Kluwer Academic Publishers, by Harry Bleeker, Peter van den Eijnden and Frans de Jong, 1993.

Primary Examiner—Ellis B. Ramirez
Assistant Examiner—Patrick J. Assouad
Attorney, Agent, or Firm—Blakely, Sokoloff, Taylor & Zafman

[57] ABSTRACT

A microprocessor is provided with circuitry for receiving JTAG and ICE test control signals through JTAG test ports and for synchronizing the test signals to a chip clock signal. Test signals synchronized to an external JTAG device are processed internally by an ICE of the microprocessor chip once the test signals are synchronized with the chip clock rate. To this end, the microprocessor is provided with a synchronizer which receives the chip clock signal, a JTAG control signal, and a JTAG reset signal, and outputs a synchronized control signal. The synchronizer includes an unclocked SR flip-flop for sampling the JTAG control signal, and two or more DR flip-flops for synchronizing the JTAG control signal to the chip clock signal. The synchronizer may be configured to generate a control signal pulse or a control signal level. The synchronizer is protocol independent, i.e., the clock rate of the JTAG test commands is independent of the chip clock. Hence, no protocol is required to connect the JTAG test command signals to the ICE. In particular, the synchronizer includes an input stage configured for allowing the JTAG control signal to be much slower than the core clock signal or much faster than the core clock signal.

23 Claims, 5 Drawing Sheets

METHOD AND APPARATUS FOR SYNCHRONIZING A JTAG TEST CONTROL SIGNAL TO AN ON-CHIP CLOCK SIGNAL

BACKGROUND OF THE INVENTION

1. Related Applications

This Patent Application is related to co-pending patent application Ser. No. 07/999,387, filed Dec. 31, 1992, entitled "Apparatus for Transferring Information Between an Interrupt Producer and an Interrupt Service Environment", of James W. Alexander, which is assigned to Intel Corporation, the Assignee of the present application, and which is incorporated by reference herein.

2. Field of the Invention

The invention generally relates to integrated circuits such as microprocessors and microcontrollers and in particular to microprocessors and microcontrollers provided with a test control capability.

3. Description of Related Art

Microprocessor and microcontroller devices are commonly provided with interchip testing capability. One example is a test system adapted to the IEEE Joint Test Action Group (JTAG) test protocols identified as IEEE standard 1149.1. In such a system, a JTAG test device is connected to a pair of integrated chips or to a single chip. The JTAG device generates test commands for testing the chips. Input and output of JTAG test commands is achieved through a set of JTAG-dedicated pins provided on each chip to be tested. Typically, the JTAG test device is employed to perform a "boundary-scan test". The JTAG test commands are typically drawn from a fairly limited set of commands particularly adapted for testing the interconnections of integrated chips and are not typically well suited for testing or monitoring the internal logic of a chip. General information regarding boundary-scan test strategies and implementations may be found in "Boundary-Scan Test, A Practical Approach", by Harry Bleeker, Peter Van Den Eijnden and Frans de Jong, Kluwer Academic publishers 1993.

Many integrated chips are additionally provided with an on-chip test device adapted for providing test visibility onto the internal logic and functions of the chip. For example, the Intel family of microprocessor chips typically include an in-circuit emulator (ICE) for use in testing, debugging and monitoring the microprocessor chip. The ICE duplicates and imitates behavior of the chip by using programming techniques and special machine features which permit the ICE to execute microcode and assembly language written for the chip. An ICE monitor external to the chip generates ICE test input signals and receives and evaluates responsive test output signals. Initially, the ICE was employed only during development and debugging of the chip and was retained in the final commercial chip only to avoid the need to provide a second die for creating a chip having the ICE. Although initially retained solely as an artifact of the design and debugging process, more recently the ICE has been employed for performing in-circuit testing of the chip after fabrication. Access to the ICE is typically achieved with a set of ICE-dedicated pins provided on the microprocessor chip. The ICE-dedicated pins are unused during normal processor execution.

The provision of both boundary-scan type JTAG testing and in-circuit ICE testing allows for a fairly comprehensive set of test commands for testing and monitoring the microprocessor chip. However, the need to provide separate pins for JTAG access and for ICE access is undesirable, particularly for microprocessor chips having a large set of required pins wherein the additional pins for both ICE and JTAG testing cannot easily be accommodated. Moreover, there is some redundancy in on-chip circuitry required for processing both JTAG commands and ICE commands.

It would be desirable to provide a mechanism which reduces the number of separate JTAG and ICE pins and any redundant circuitry. However, ICE test commands are synchronized to a chip core clock signal, which may be clocked at 50–150 MHz or more. The JTAG test commands are generated at, and synchronized to, a JTAG clock rate, which is typically 12 MHz. As such, merging of the JTAG and ICE command functions is not straight-forward. Indeed, even if the JTAG commands were to be generated at the same frequency as the ICE commands, the JTAG commands would still not be synchronized with the chip clock signals. Indeed, the IEEE standard defining JTAG protocol specifically states that the JTAG clock may not be specified with respect to any other clock, especially a core clock.

SUMMARY OF THE INVENTION

One general object of the invention is to provide an integrated chip capable of receiving and processing both JTAG and ICE test commands, without requiring a complete set of separate test pins. A more particular object of the invention is to provide a method and apparatus for synchronizing test control signals received by a microprocessor chip through JTAG input/output pins from an off-chip JTAG test signal generating device, such as an ICE monitor, to an on-chip clock signal in a manner independent of JTAG protocol.

These and other objects of the invention are achieved by a system comprising: a integrated chip core processing means for processing signals synchronized to a first clock signal; an off-chip test means for generating test signals synchronized to a second clock signal; and conversion means for converting the test signals synchronized to the second clock signal to test signals synchronized to the first clock signal, such that the core processing means receives and processes test signals generated by the off-chip test means in a coherent and predictable manner. The test signals may include, for example, test, debug or monitor commands.

In a preferred embodiment, the system is a microprocessor or microcontroller which includes an on-chip test means for processing test commands synchronized to the on-chip clock signal. Preferably, the on-chip test means is an ICE and the off-chip test means is an ICE monitor capable of generating JTAG test signals. The converter means includes an on-chip test controller means for receiving test signals generated by the off-chip ICE monitor. In response to the test command received from the off-chip test means, the on-chip test controller means generates a test command, a test control signal and a test reset signal, each synchronized to the second clock signal.

The conversion means also includes a first command register for receiving and holding the test command provided by the on-chip test controller means, and a second command register means for receiving the test command from the first register and for outputting the test command to the ICE. A synchronizer means resynchronizes the test control signal from the second clock signal to the first clock signal. The conversion means also includes means for transferring the test command from the first register means to the second register means under control of the test control signal output from the synchronizer means.

The synchronizer means is configured for allowing the test control signal provided at the second clock rate to be properly synchronized even though it is either much slower than the first clock signal or much faster than the first clock signal.

Hence, in one embodiment, a synchronizer means is provided as a component of the system of the invention. However, the synchronizer means is, by itself, also part of the invention, independent of other processor chip elements.

In accordance with an alternative embodiment, the invention provides a method for synchronizing a control signal. In its various embodiments, the invention provides a method and apparatus for converting a test control signal provided by an off-chip device to a signal synchronized to the on-chip clock signal. The method and apparatus is particularly adapted for synchronizing a JTAG control signal to an on-chip clock signal for use in a microprocessor having an ICE. By synchronizing the JTAG control signal, the JTAG input and output ports provided on a microprocessor chip may be employed for accessing the ICE thereby eliminating or reducing the need for separate sets of test control pins for JTAG and ICE.

Other objects and advantages of the invention will be apparent from the detailed description of the invention set forth below.

DETAILED DESCRIPTION OF THE INVENTION

Figure 1:
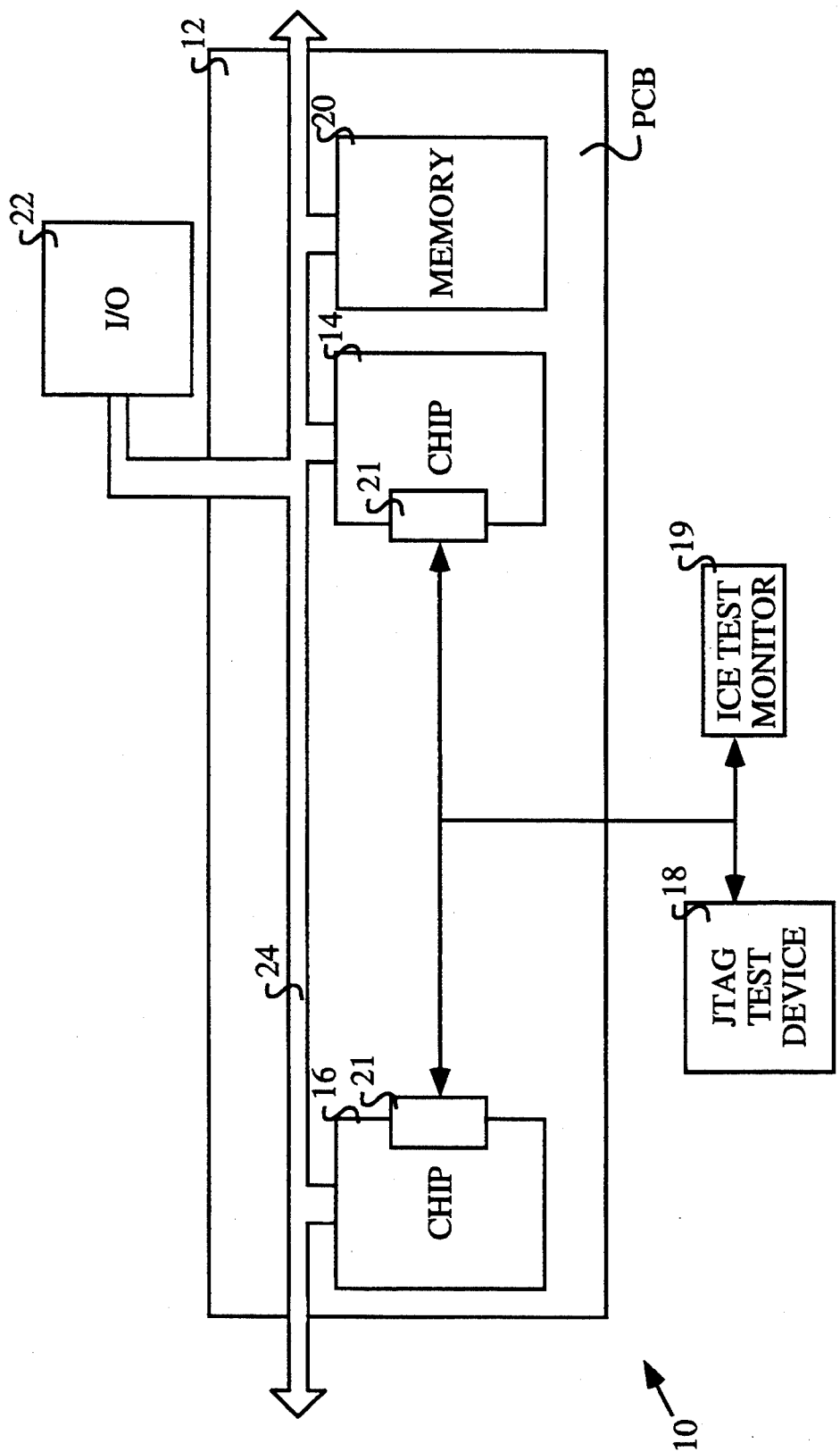
FIG. 1 is a block diagram illustrating a printed circuit board having a pair of microprocessor chips with the microprocessor connected to a JTAG control device and an ICE monitor.

Referring to the figures, preferred embodiments of the invention will now be described. FIG. 1 is a high level block diagram illustrating a computer system 10 including a printed circuit board (PCB) 12 having a pair of integrated circuit chips 14 and 16, a memory device 20 and an input/output device 22 for use in accessing integrated chips 14 and 16. A bus line 24 interconnects integrated chip 16, integrated chip 14, input/output device 22 and memory device 20 for transmitting data and commands there-between. Integrated chip 14 may be a microprocessor, microcontroller or other device such as, for example, a microprocessor chip of the 296 family of embedded processor chips provided by Intel Corporation. Integrated chip 16 is another integrated chip device, such as a coprocessor device. Only pertinent components of the computer system are illustrated in FIG. 1. Numerous otherwise conventional computer system elements are not illustrated.

A JTAG test control device 18 and an ICE test monitor 19 are connected to chips 14 and 16 of PCB 12. For clarity in describing and illustrating functional components of the invention, JTAG device 18 and ICE monitor 19 are shown separately. Preferably, however, the ICE monitor is configured to include the JTAG test control device or, more specifically, to include the capability to generate private JTAG signals. In general, JTAG test control device 18 generates and processes test, debug and monitoring signals, for input and output to chips 14 and 16 along conventional JTAG signal lines, namely, input (TDI)/output (TDO), status (TMS), reset (JRESET) and clock line (JCLK) (not separately shown). An input port 21, having five pins, is provided on each of the chips 14 and 16 for receiving or outputting the five JTAG signals. In accordance with conventional JTAG test methodologies, test signals are generated by JTAG device 18 which test the interconnections of the chips to ensure proper interconnection.

ICE monitor 19 provides signals, also along the conventional JTAG lines, for testing, monitoring or debugging internal functionality and interconnections of chip 14. Thus, the test signals provided to chip 14 through the JTAG pins may not be limited solely to JTAG test signals, but may include additional signals for testing the internal operation of chip 14 via an ICE within the chip. Although these additional test commands go beyond conventional JTAG protocol, the commands are provided to chip 14 through the conventional five JTAG input/output pins provided on the chip. In this manner, a complete separate set of ICE test pins are not required to allow for testing of the internal functionality of chip 14. It should be noted that at least some of the conventional ICE test pins may be retained on chips 14 and 16 to facilitate certain conventional ICE operations such as ICE commands for suspending operation of the chip. Hence, in the preferred embodiment, not all ICE test pins are eliminated. For clarity, separate ICE pins and separate lines connecting ICE monitor 19 and the ICE pins are not shown. Also, although a dedicated connection line is illustrated between JTAG test device 18, ICE test monitor 19 and chips 14 and 16, such an interconnection could also be provided using system bus line 24. Such configuration details may vary in accordance with particular implementations.

ICE monitor 19 may be a conventional ICE monitor, or, as noted above, a modified ICE monitor configured to provide ICE and JTAG commands along only five input and output lines. Details of the configuration of the ICE monitor 19 and the particular test control signals generated and processed therein may be otherwise conventional and will not be described in further detail herein.

Figure 2:
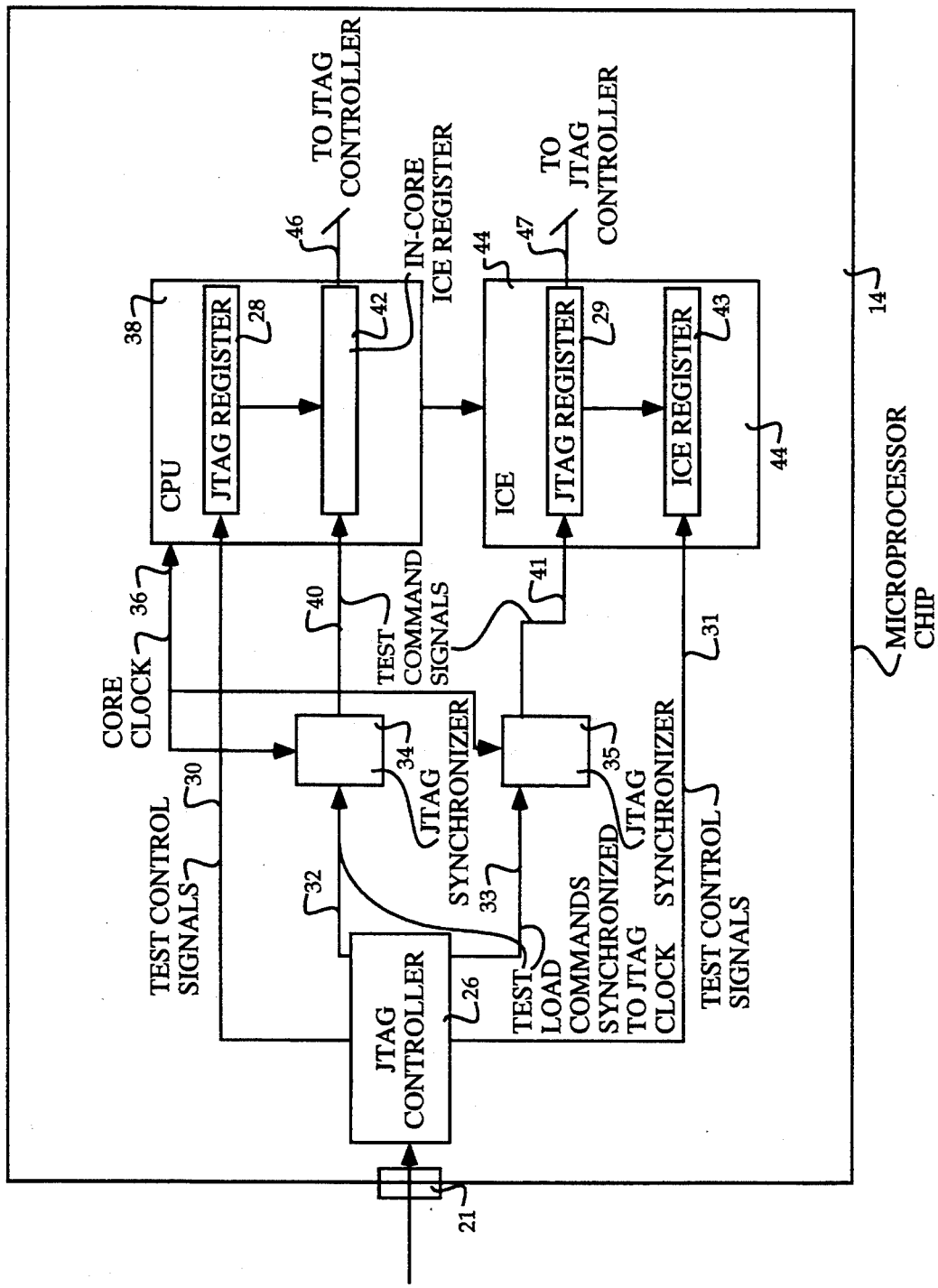
FIG. 2 is a block diagram illustrating pertinent portions of one of the microprocessor chips of FIG. 1.

Referring to FIG. 2, architecture within microprocessor chip 14 is illustrated. Test signals received through JTAG port 21 are processed by a JTAG controller 26 which may be a conventional JTAG state machine. More specifically, JTAG controller 26 receives signals on five JTAG pins corresponding to input, output, status, reset and JTAG clock. The input signal typically contains a test command. The input and JTAG clock signals are transmitted from JTAG controller 26 to various JTAG registers positioned within the microprocessor chip. In FIG. 2, two exemplary JTAG registers, 28 and 29 are illustrated. The JTAG registers are connected and configured adjacent to corresponding ICE registers. Two exemplary ICE registers 42 and 43 are illustrated with ICE register 42 connected to JTAG register 28 and ICE register 43 connected to JTAG register 29. All ICE registers functionally form a portion of an ICE module 44. However, for layout reasons, some of the ICE registers are physically positioned within a separate CPU or core module 38. For example, ICE register 42 is shown within CPU 38, although, from a functional standpoint, ICE register 42 is a portion of the ICE module of the microprocessor chip. Accordingly, in FIG. 2, ICE register 42 is identified as an in-core ICE register.

Preferably, microprocessor chip 14 is configured such that each ICE register, which would otherwise be provided for ICE testing and monitoring, includes a JTAG register connected thereto.

In FIG. 2, test command signals are transmitted from JTAG controller 26 to JTAG register 28 along an interconnection line 30. Test signals are transmitted from JTAG controller 26 to JTAG register 29 along a separate interconnection line 31. As can be appreciated from the description of FIG. 1 above, test signals received by JTAG controller 26 and transferred to the various JTAG registers need not be conventional JTAG test signals but may also include ICE signals received from ICE monitor 19 (FIG. 1) for use in ascertaining internal states of microprocessor chip 14.

In addition to outputting test command signals to individual JTAG registers, JTAG controller 26 also outputs a load or control signal for use in triggering a transference of JTAG commands from the JTAG registers to corresponding ICE registers. The JTAG load signals are generated by JTAG controller 26 and are initially synchronized to the external JTAG clock signal (JCLK). Hence, the load signals are asynchronous with respect to the core clock. To ensure that the JTAG test commands are loaded into the ICE registers in synchronization with the core clock signal, a JTAG synchronizer is provided in connection with each ICE register for resynchronizing the load signals to the core clock signal.

More specifically, a JTAG synchronizer 34 is connected between JTAG controller 26 and in-core ICE register 42. A signal line 32 carries a load signal and a reset signal from JTAG controller 26 to JTAG synchronizer 34. JTAG synchronizer 34 also receives a core clock signal from CPU 38 along a line 36. The load signal, after synchronization to the core clock, is output from JTAG synchronizer 34 to ICE register 42 along a line 40.

A second JTAG synchronizer 34, is connected between JTAG controller 26 and ICE register 43 via connection lines 33 and 41. JTAG synchronizer 35 also receives the core clock signal along line 36.

Thus, each JTAG register receives a JTAG command or an ICE command which needs to be shifted into the corresponding ICE register for use in testing or monitoring the CPU. JTAG synchronizers 34 and 35 provide core-clock-synchronized load signals which trigger the shifting of the test commands from the JTAG registers into corresponding ICE registers. Preferably, the test commands are shifted from JTAG registers into corresponding ICE registers in parallel. Thereafter, the test commands are shifted into the CPU or ICE circuitry, also in parallel. Hence, test commands are fed into the core at a core clock synchronized clock rate, rather than at the JTAG clock rate at which the test commands are initially received. It should be noted that, ICE 44 is clocked at the same core clock rate as CPU 38.

Ultimately, signals responsive to the test commands are returned to ICE registers 42 and 43. The commands are then output to the external JTAG device or ICE monitor (FIG. 1). Preferably, the test commands are shifted out of registers 42 and 43 along lines 46 and 47 which, although not explicitly shown, are connected to an output pin of port 21. Alternatively, the test commands could be shifted back into the JTAG registers 28 and 29 for return along lines 30 and 31 to JTAG controller 26. Either implementation is feasible and the particular choice of implementation depends upon a particular desired configuration. In the embodiment wherein test signals are transmitted along lines 46 and 47 to port 21, the signals are preferably processed in accordance with the teachings of the U.S. Patent Application entitled "Method and Apparatus for Translating Information Between an Interrupt Producer and an Interrupt Service Environment", incorporated by reference above.

Figure 3:
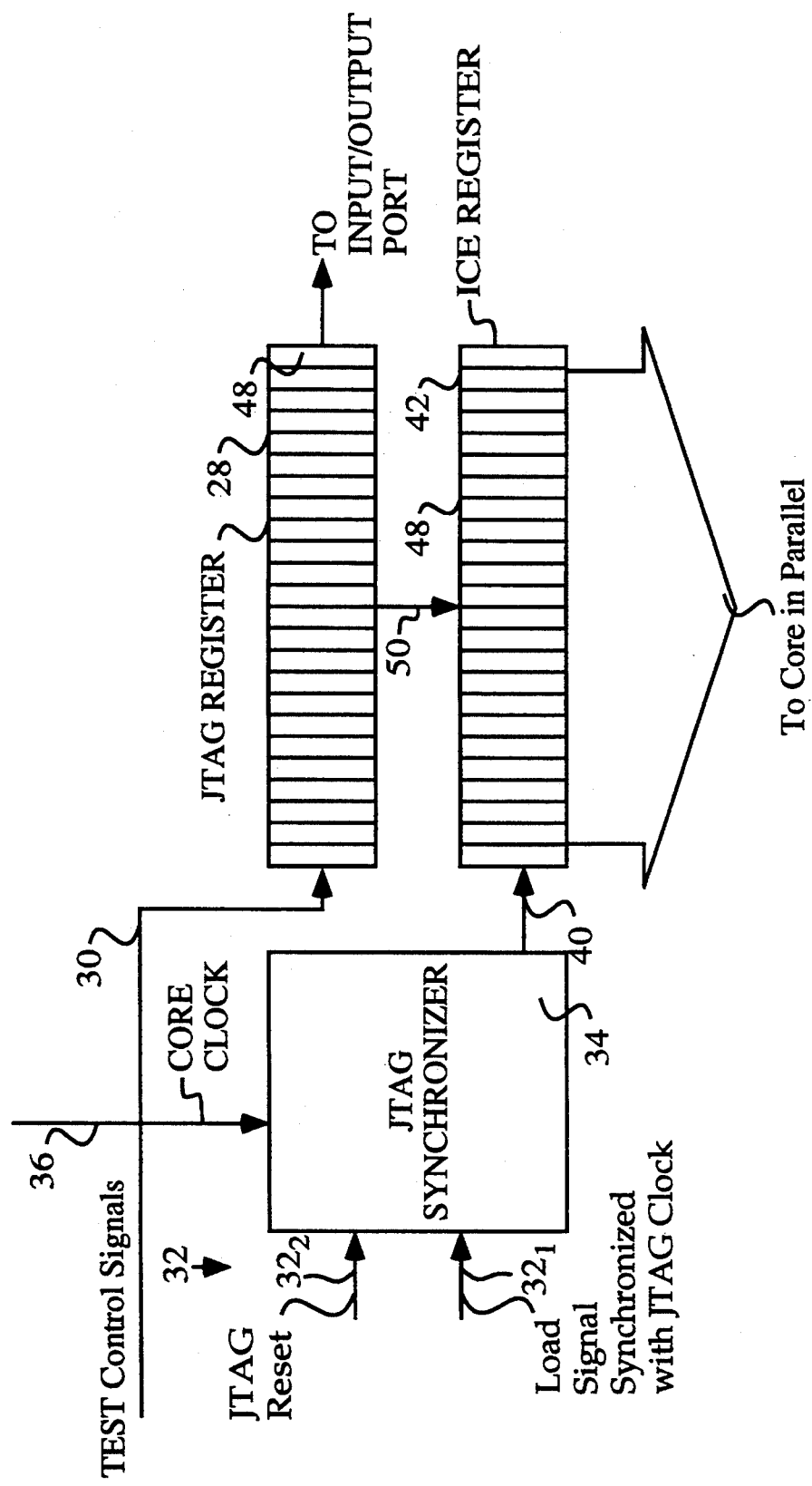
FIG. 3 is a block diagram, further illustrating a JTAG synchronizer, a JTAG register and an ICE register of FIG. 2.

The interconnections of synchronizer 34, JTAG register 28 and core register 42 are shown in greater detail within FIG. 3. As can be seen in FIG. 3, both JTAG register 28 and ICE register 42 each include storage elements for a certain number of bits, typically twenty-four, with each individual storage element denoted by reference numeral 48. Each storage element 48 may be formed of a conventional bit storage element, such as a flip-flop. Interconnection between JTAG register 28 and ICE register 42 is provided along a bus 50. Additional circuitry (not shown) is provided for transferring bits from JTAG register 28 to core register 42. The circuitry operates to simultaneously shift all bits from JTAG register 28 to ICE register 42. The shift is performed in response to the JTAG load or control signal received from JTAG synchronizer 34 along line 40. With the control signal synchronized to the chip clock by synchronizer 34, bits are shifted into ICE register 42 synchronized to the chip clock signal. In this manner, test commands may be received through port 21 (FIG. 1) and input to the core, despite the fact that the signals received through JTAG port 21 are initially synchronized to a different clock signal than the core.

It should be noted that, in some implementations, it may be desirable to provide two JTAG registers in connection with each ICE register. Such may be provided to facilitate the receipt of the test command signals and their transference to the ICE register.

Figure 4:
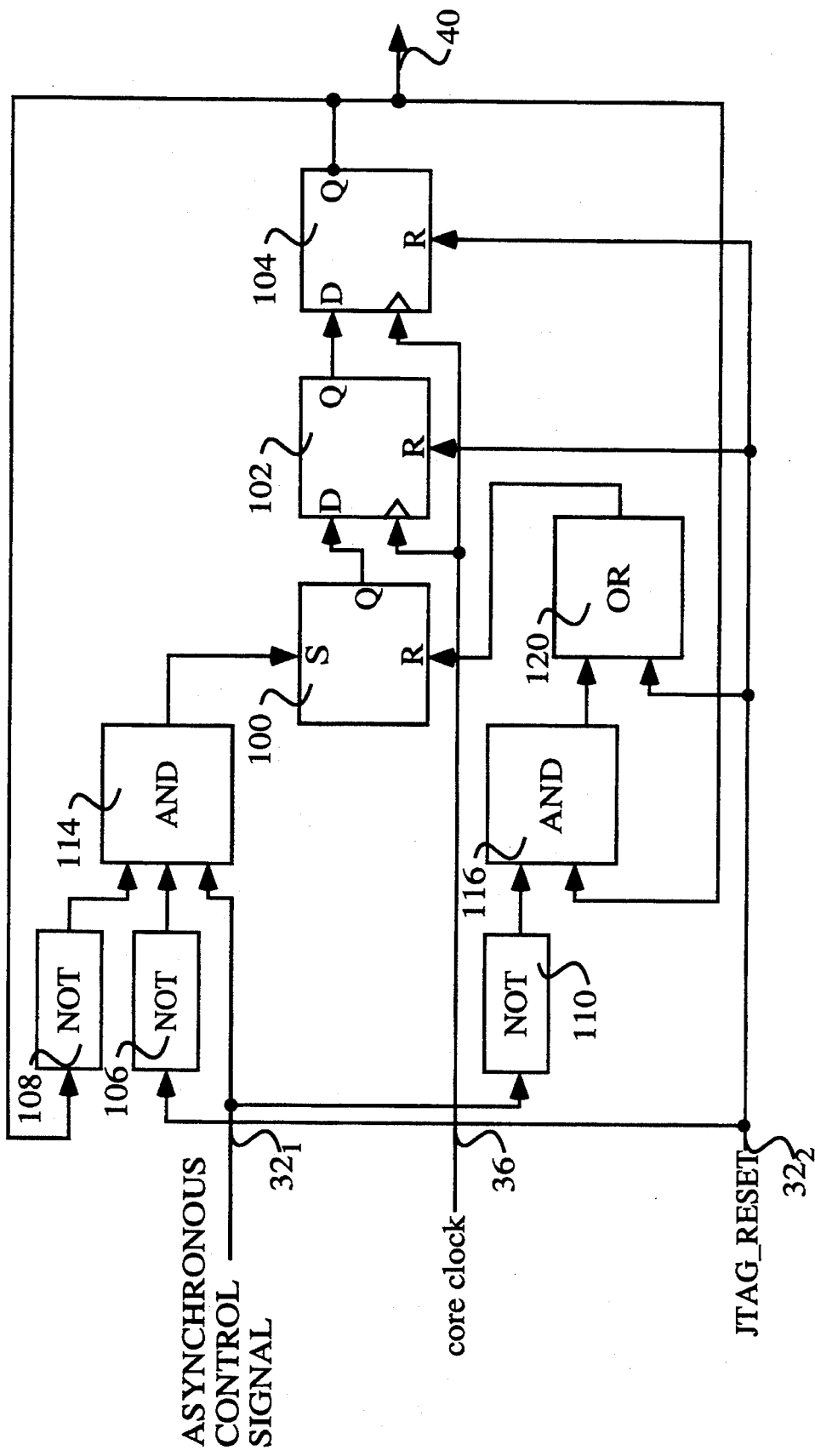
FIG. 4 is a block diagram, illustrating a first preferred embodiment of the JTAG synchronizer of FIG. 3.
Figure 5:
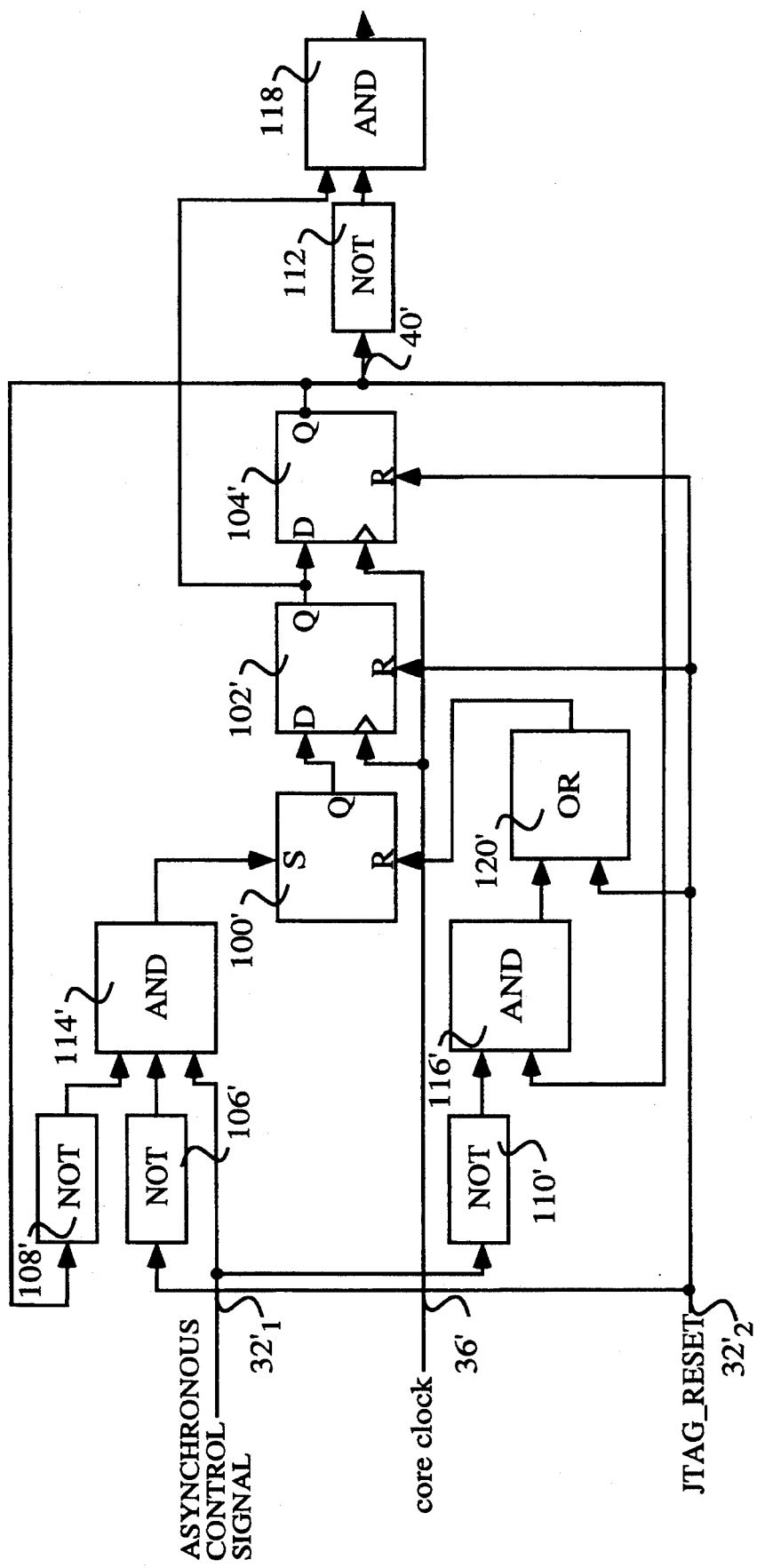
FIG. 5 is a block diagram illustrating a second preferred embodiment of the JTAG synchronizer of FIG. 3.

FIGS. 4 and 5 illustrate two preferred embodiments of synchronizer 34. FIG. 4 illustrates a synchronizer which generates a control signal level. FIGS. 5 illustrates a synchronizer which generates a control signal pulse.

Referring first to FIG. 4, synchronizer 34 receives a core clock signal along line 36, a JTAG-synchronized load signal along line 32 and a JTAG reset signal along line $32_2$. Synchronizer 34 includes a single asynchronous SR flip-flop 100, a pair of D flip-flops or registers 102 and 104, three inverters or NOT-gates 106, 108 and 110, two AND-gates 114 and 116 and a single OR-gate 120.

NOT-gates 106, 108 and 110, AND-gates 114 and 116, and OR-GATE 120 together provide an input stage for preprocessing the input signals. SR flip-flop 100 represents a sample stage for sampling the load signal. D flip-flops 102 and 104 together provide a two-stage synchronizer for re-synchronizing the load signal sampled by the sample stage.

Considering the interconnections of these elements in greater detail, the asynchronous load signal received along line $32_1$ is inverted by NOT-gate 110 then combined with an output signal of D flip-flop 104 by AND-gate 116. The combined signal output from AND-gate 116 is OR'ed with the JTAG reset signal by OR-gate 120. The output of OR-gate 120 is connected to an R input of SR flip-flop 100.

The input asynchronous load signal received along line $32_1$ is also connected into a first input of a three-input AND-gate 114. A second input of AND-gate 114 receives the output of D flip-flop 104, inverted by NOT-gate 108. A third input of AND-gate 114 receives the JTAG reset signal inverted by NOT-gate 106. An output of three-input AND-gate 114 is connected to the S input of SR flip-flop 100.

SR flip-flop 100, which is an unclocked flip-flop, captures the JTAG control signal received along line $32_1$. SR flip-flop 100 is not clocked since a valid control signal pulse can appear on input line $32_1$ between rising edges of the core clock signal.

A Q-output of SR flip-flop 100 is connected into a D-input of D flip-flop 102. D flip-flop 102 is a clocked flip-flop receiving the core clock signal along line 36. D flip-flop 102 is reset by JTAG reset signal received along line 322 and input via a R-input. A Q-output of D flip-flop 102 is connected to a D-input of D flip-flop 104. D flip-flop 104 is also a clocked flip-flop receiving the core clock signal along line 36. As with D flip-flop 102, D flip-flop 104 has an R-input connected to JTAG reset line 322.

Together D flip-flops 102 and 104 operate as a two-stage synchronizer to synchronize the unclocked output from SR flip-flop 100 with the core clock received along line 36. At least two D flip-flops are provided within the two-stage synchronizer to substantially eliminate the meta-stability problems which could occur if the unclocked output from SR flip-flop 100 is aligned with the core clock signal. It should be noted that additional D flip-flops may be required to reduce meta-stability problems. In general, the number of stages required for meta-stability removal is dependent upon the core clock rate, the rate by which the load signals are received along line $32_1$, and the electrical characteristics of any amplifiers used to implement the D flip-flops. The determination of the proper number of D flip-flops is achieved using conventional meta-stability analysis, and will not be described further, other than to note that even in a worst case no more than five or six D flip-flops should be required. The additional stages are added after D flip-flop 104 and are connected in the same manner as elements 102–104.

The input stage, described above, allows for the JTAG command or load signal to be much slower than the core clock or much faster than the core clock. More specifically, the feed-back of the output signal from flip-flop 104 through AND-gate 116 and OR-gate 120 to SR flip-flop 100 prevents SR flip-flop 100 from being cleared until the synchronizer has had a chance to recognize the asynchronous control signal (provided that control signal line $32_1$ is still active). If the asynchronous control signal received along line $32_1$ is inactive after synchronization, then SR flip-flop 100 can be cleared. The foregoing is a particularly desirable feature of the synchronizer since, as noted above, JTAG test control signals are typically clocked at about 12 MHz whereas the ICE and the core are clocked at a much faster rate, such as 50–100 MHz. Also it is particularly desirable that the synchronizer not "lose" any JTAG commands when the core clock is running much slower than the JTAG clock. This can happen when the microprocessor has been placed in a power conservation state and the core clock has been stopped. The input stage also operates to prevent an input of $S=R=1$ on SR flip-flop 100. Such an input condition on an SR flip-flop represents an illegal input condition which could result in an undefined output.

FIG. 5 illustrates an alternative synchronizer which operates to generate a signal pulse rather than a signal level. All elements of the synchronizer of FIG. 5 are identical to elements of FIG. 4 except that a rising edge detector is provided. In FIG. 5, elements identical to those of FIG. 4 are represented with like reference numerals with primes attached. As those elements operate in the same manner as corresponding elements in FIG. 4, such operation will not be described again. Rather, only the relevant differences between the embodiment of FIG. 5 and that of FIG. 4 will be noted. In particular, in FIG. 5, a Q-output of D flip-flop 104' is inverted by a NOT-gate 112 and combined, using an AND-gate 118 with the Q-output of D flip-flop 102'. The resulting output of AND-gate 118 is a pulse having a leading edge synchronized with the core clock signal, but triggered by load signal received along line $32_1$.

Whether implemented as in FIG. 4 or as in FIG. 5, synchronizer 34 operates to generate as a test control signal, synchronized with the core clock for use in triggering shifting of test control bits from a JTAG register to an ICE register. The choice of whether to use the synchronizer implementation of FIG. 4 or that of FIG. 5 depends in part upon the particular implementation of the registers and the control circuitry associated therewith.

What has been described is a microprocessor chip having the capability of receiving test control signals through JTAG ports, synchronized with the JTAG clock rate, then re-synchronizing those control signals to a core clock rate. In this manner, the JTAG ports can be used for transmitting non-conventional test commands for use in testing internal functionality of the microprocessor chip in addition to JTAG protocol signals. One specific synchronizer circuit is provided for use in synchronizing a control signal received through the JTAG ports to the core clock signal. Other circuitry may also be employed consistent with the general principles of the invention.

What is claimed is:

1. A system, comprising:
   off-chip test means for generating test commands synchronized to a first clock signal; and
   an integrated circuit chip coupled to said off-chip test means, said integrated circuit chip comprising:
   core processing means for processing commands synchronized to a second clock signal; and
   conversion means for converting said test commands synchronized to said first clock signal to test commands synchronized to said second clock signal, such that said core processing means receives and processes test commands generated by said off-chip test means, said conversion means comprising:
   an on-chip test controller means for receiving a test command generated by said off-chip test means and for generating a test command, a test reset, and a test control signal, each synchronized to said first clock signal;

a first command register for receiving and holding said test command provided by said on-chip test-controller means;

a second command register for receiving said test command from said first register and for outputting said test command to said core processing means;

a synchronizer for synchronizing said test control signal from said first clock signal to said second clock signal; and means for transferring said test command from said first command register to said second command register, said transfer being triggered by said control signal output from said synchronizer.

2. The system of claim 1, wherein said off-chip test means includes a means for generating test commands according to Joint Test Action Group (JTAG) protocols and said on-chip test controller means is a JTAG state machine.

3. The system of claim 1, wherein said synchronizer means comprises:

a control line for receiving said test control signal synchronized to said first clock signal;

a clock line for receiving a clock signal synchronized to said second clock signal;

a reset line for receiving a reset signal from said on-chip test controller means;

sample means for sampling said test control signal synchronized to said second clock signal, said sample means including an unclocked SR flip-flop having an S-input connected to said control line and an R-input connected to said reset line; and synchronization means for synchronizing output from sample means to said first clock signal, said synchronization means including a first D flip-flop having a D-input connected to an output of said SR flip-flop, an R-input connected to said reset line means, and a clock input connected to said clock line, and a second D flip-flop having a D-input connected to an output of said first D flip-flop, an R-input connected to said reset line, and a clock input connected to said clock line, such that said synchronization means outputs a control signal level.

4. The system of claim 3, further including a means for converting said control signal level output from said synchronization to a control pulse.

5. The system of claim 4, wherein said means for converting said control signal level output from synchronization means to a control pulse comprises an AND-gate having a first input connected to said output of said first D flip-flop, and a second input connected, through a NOT-gate, to said output of said second D flip-flop, said AND-gate providing an output control signal pulse.

6. The system of claim 3, further including an input stage comprising:

a first AND-gate having a first input connected to said control line, a second input connected, through a NOT-gate, to said reset line, a third input connected, through a NOT-gate, to said output of said second D flip-flop, and an output connected to said S-input of said SR flip-flop; and a second AND-gate having a first input connected, through a NOT-gate, to said control line, a second input connected to said output of said second D flip-flop, and an output connected to a first input of a OR-gate, with said OR-gate having a second input connected to said reset line and an output connected to said R-input of said SR flip-flop.

7. The system of claim 1, further including an in-circuit emulator means for processing test commands synchronized to said second clock signal.

8. A synchronizer for synchronizing a control signal from a first clock signal to a second clock signal, said synchronizer comprising:

a control line for receiving a control signal synchronized to said first clock signal;

a clock line for receiving said second clock signal;

a reset line for receiving a reset signal;

an SR flip-flop having an S-input connected to said control line and a R-input connected to said reset line; and synchronization means for synchronizing output from said SR flip-flop to said second clock signal, said synchronization means including a first D flip-flop having a D-input connected to an output of said SR flip-flop, an R-input connected to said reset line, and a clock input connected to said clock line, and a second D flip-flop having a D-input connected to an output of said first D flip-flop, an R-input connected to said reset line, and a clock input connected to said clock line, such that said synchronization means outputs a control signal level.

9. The synchronizer of claim 8, further including:

an AND-gate having a first input connected to said output of said first D flip-flop, and a second input connected, through a NOT-gate, to said output of said second D flip-flop, said AND-gate providing a synchronous control signal pulse.

10. The synchronizer of claim 8, further including an input stage comprising:

a first AND-gate having a first input connected to said control line, a second input connected, through a NOT-gate, to said reset line, a third input connected, through a NOT-gate, to said output of said second D flip-flop, and an output connected to said S-input of said SR flip-flop; and a second AND-gate having a first input connected, through a NOT-gate, to said control line, a second input connected to said output of said second D flip-flop, and an output connected to a first input of a OR-gate, with said OR-gate having a second input connected to said reset line and an output connected to said R-input of said SR flip-flop.

11. A synchronizer for synchronizing an asynchronous control signal, said synchronizer comprising:

a control line receiving a synchronous control signal;

a clock input line receiving a clock signal;

a reset line receiving a reset signal;

an SR flip-flop having a S-input connected to said control line and a R-input connected to said reset line;

a first D flip-flop having a D-input connected to an output of said SR flip-flop, a R-input connected to said reset line, and a clock input connected to said clock line;

a second D flip-flop having a D-input connected to an output of said first D flip-flop, an R-input connected to said reset line, and a clock input connected to said clock line;

a first AND-gate having a first input connected to said control line, a second input connected, through a NOT-gate, to said reset line, a third input connected, through a NOT-gate, to said output of said second D flip-flop, and an output connected to said S-input of said SR flip-flop; and a second AND-gate having a first input connected, through a NOT-gate, to said control line, a second input connected to said output of said second D flip-flop, and an output connected to a first input of a OR-gate, with said OR-gate having a second input connected to said reset line and an output connected to said R-input of said SR flip-flop.

12. The synchronizer of claim 11, further including:
a third AND-gate having a first input connected to said output of said first: D flip-flop, and a second input connected, through a NOT-gate, to said output of said second D flip-flop, said third AND-gate providing an output synchronous control signal pulse.

13. A method comprising-the steps of:
receiving an asynchronous control signal;
receiving a clock signal;
receiving a reset signal;
sampling said asynchronous control signal by passing said asynchronous control signal through a S-input of a SR flip-flop and passing said reset signal through a R-input of said SR flip-flop; and
synchronizing said asynchronous control signal by
passing an output of said SR flip-flop through a D-input of a first D flip-flop and passing said clock signal through a R-input of said SR flip-flop, and
passing an output of said first D flip-flop through a D-input of a second D flip-flop, passing said reset signal through an R-input of said first D flip-flop, and passing said clock signal into a clock input of said D flip-flop, such that a synchronous control signal level is produced.

14. The method of claim 13, further including the step of converting said synchronous control signal level output to a synchronous control pulse.

15. The method of claim 14, wherein said step for converting said synchronous control signal level output to a synchronous control pulse comprises
passing said output of said first D flip-flop through an AND-gate, and passing an output of said second D flip-flop through a NOT-gate and through a second input of said second flip-flop to provide an output synchronous control signal pulse.

16. The method of claim 13, further including the steps of:
passing said asynchronous control signal through a first input of a first AND-gate, passing said reset signal through a NOT-gate into a second input of said first AND-gate, passing an output of said second D flip-flop through a NOT-gate into a third input of said AND-gate, and passing an output of said AND-gate into said S-input of said SR flip-flop;
passing said asynchronous control signal through a NOT-gate into a first input of a second AND-gate, passing said output of said second D flip-flop into a second input of said second AND-gate; and
passing an output of said second AND-gate into a first input of an OR-gate, passing said reset signal into a second input of said OR-gate, and passing an output of said OR-gate into said R-input of said SR flip-flop.

17. An integrated circuit operative to process commands synchronized to a first clock signal, comprising:
a test controller operative to generate a test command signal and a test control signal, each being synchronized to a second clock signal provided by a source external to the integrated circuit;
a first command register coupled to receive the test command signal from the test controller;
a synchronizer circuit coupled to receive the test control signal, the synchronizer circuit being operative to output a synchronized control signal that is synchronized from the second clock signal to the first clock signal; and
a second command register coupled to the first command register and the synchronizer circuit, the second command register being operative to load the test command from the first command register in response to the synchronized control signal such that the test command signal is loaded into the second command register synchronously with the first clock signal.

18. The integrated circuit of claim 17, wherein the integrated circuit further comprises an in-circuit emulator circuit that processes commands synchronized to the first clock signal, the in-circuit emulator circuit being coupled to the second command register for executing commands that have been loaded into the second command register.

19. The integrated circuit of claim 18, wherein the test controller includes a state machine that operates according to Joint Test Action Group (JTAG) test protocols.

20. The integrated circuit of claim 18, wherein the test controller further generates a test reset signal synchronized to the second clock signal, the synchronizer circuit further being coupled to receive the test reset signal, the synchronizer circuit comprising:
a sampling circuit having an input coupled to receive the test control signal, the sampling circuit being operative to sample a state of the test control signal and to output a sampled control signal, the sampling circuit operating asynchronously with the first and second clock signals; and
a synchronizing circuit coupled to receive the sampled control signal and the first clock signal, the synchronizing circuit being operative to generate the synchronized signal in response to the sampled control signal and the first clock signal.

21. The integrated circuit of claim 20, wherein the sampling circuit comprises an SR flip-flop having an S-input coupled to receive the test control signal, an R-input coupled to receive the test reset signal, and a Q-output four outputting the sampled control signal.

22. The integrated circuit of claim 21, wherein the synchronizing circuit comprises:
a first D flip-flop having a D-input coupled to receive the sampled control signal, a clock input coupled to receive the first clock signal, an R-input coupled to receive the test reset signal, and a Q-output; and
a second D flip-flop having a D-input coupled to the Q-output of the first D flip-flop, a clock input coupled to receive the first clock signal, an R-input coupled to receive the test reset signal, and a Q-output operative to output the synchronized control signal.

23. The integrated circuit of claim 22, wherein the synchronizer circuit further comprises:
- a first inverter having an input coupled to receive the synchronized control signal;
- a second inverter coupled to the test reset signal;
- a first AND gate having a first input coupled to an output of the first inverter, a second input coupled to an output of the second inverter, a third input coupled to test control signal, and an output coupled to the S-input of the SR flip-flop;
- a third inverter coupled to receive the test control signal;
- a second AND gate having a first input coupled to receive an output of the third inverter, a second input coupled to receive the synchronized control signal, and an output; and
- an OR gate having a first input coupled to the output of the second AND gate, a second input coupled to the test reset signal, and an output coupled to the R-input of the SR flip-flop.

* * * * *

UNITED STATES PATENT AND TRADEMARK OFFICE
CERTIFICATE OF CORRECTION

PATENT NO.   :   5,434,804
DATED        :   July 18, 1995
INVENTOR(S)  :   Bock et al.

It is certified that error appears in the above-identified patent and that said Letters Patent is hereby corrected as shown below:

In column 9, at line 22, delete --means--.

In column 9, at line 49, delete "sychronization" and substitute --synchronizer--.

Signed and Sealed this

Fifteenth Day of October, 1996

Attest:

BRUCE LEHMAN

Attesting Officer        Commissioner of Patents and Trademarks